United States Patent
Wrycraft et al.

(10) Patent No.: US 6,842,349 B2
(45) Date of Patent: Jan. 11, 2005

(54) RACK-MOUNTED MODULE ACCESS

(75) Inventors: Sean Conor Wrycraft, Harrow (GB); Andrew John Yair, Swindon (GB)

(73) Assignee: Sun Microsystems, Inc., Santa Clara, CA (US)

( * ) Notice: Subject to any disclaimer, the term of this patent is extended or adjusted under 35 U.S.C. 154(b) by 99 days.

(21) Appl. No.: 10/370,128

(22) Filed: Feb. 18, 2003

(65) Prior Publication Data

US 2003/0161113 A1 Aug. 28, 2003

(30) Foreign Application Priority Data

Feb. 28, 2002 (GB) .............................. 0204773

(51) Int. Cl.[7] .......................... H05K 7/14; H05K 5/00
(52) U.S. Cl. ...................... 361/796; 211/41.17; 174/50
(58) Field of Search ................. 361/728, 730, 361/752, 796, 797; 174/50; 211/41.17

(56) References Cited

U.S. PATENT DOCUMENTS

| | | | | |
|---|---|---|---|---|
| 4,741,032 A | * | 4/1988 | Hampton ............... | 379/413.02 |
| 5,103,378 A | | 4/1992 | Stowers et al. | |
| 5,450,285 A | | 9/1995 | Schlemmer | |
| 5,568,362 A | * | 10/1996 | Hansson ..................... | 361/736 |
| 5,777,845 A | * | 7/1998 | Krum et al. ................ | 361/685 |
| 5,959,250 A | * | 9/1999 | Daoud ..................... | 174/65 R |
| D425,493 S | * | 5/2000 | Cutright et al. ............ | D13/184 |
| 6,061,250 A | * | 5/2000 | Lavan ........................ | 361/797 |
| 6,068,358 A | | 5/2000 | Rieger | |
| 6,201,702 B1 | | 3/2001 | Schmitt | |
| 6,396,990 B1 | * | 5/2002 | Ehn et al. ................... | 385/135 |
| 6,603,660 B1 | * | 8/2003 | Ehn et al. ................... | 361/694 |
| 6,681,942 B2 | | 1/2004 | Haney | |
| 2003/0111245 A1 | * | 6/2003 | Haggerty ..................... | 174/50 |

FOREIGN PATENT DOCUMENTS

| | | |
|---|---|---|
| EP | 0373006 | 1/1989 |
| EP | 0996207 | 4/2000 |
| FR | 2700644 | 1/1993 |
| FR | 2779901 | 6/1998 |
| GB | 1508832 | 4/1978 |
| GB | 2289618 | 11/1995 |

OTHER PUBLICATIONS

International search report application No. GB0204773.6 mailed Oct. 15, 2002.

* cited by examiner

Primary Examiner—David Martin
Assistant Examiner—Dameon E. Levi
(74) Attorney, Agent, or Firm—Meyertons Hood Kivlin Kowert & Goetzel, P.C.; B. Noël Kivlin

(57) ABSTRACT

A modular electronic circuit is described wherein circuit boards extending across the width of circuit module are removable through an access opening substantially coextensive with the front face of the module. A hinge component for mounting an access door and a grip for extracting a module from a mounting rack is also described.

7 Claims, 4 Drawing Sheets

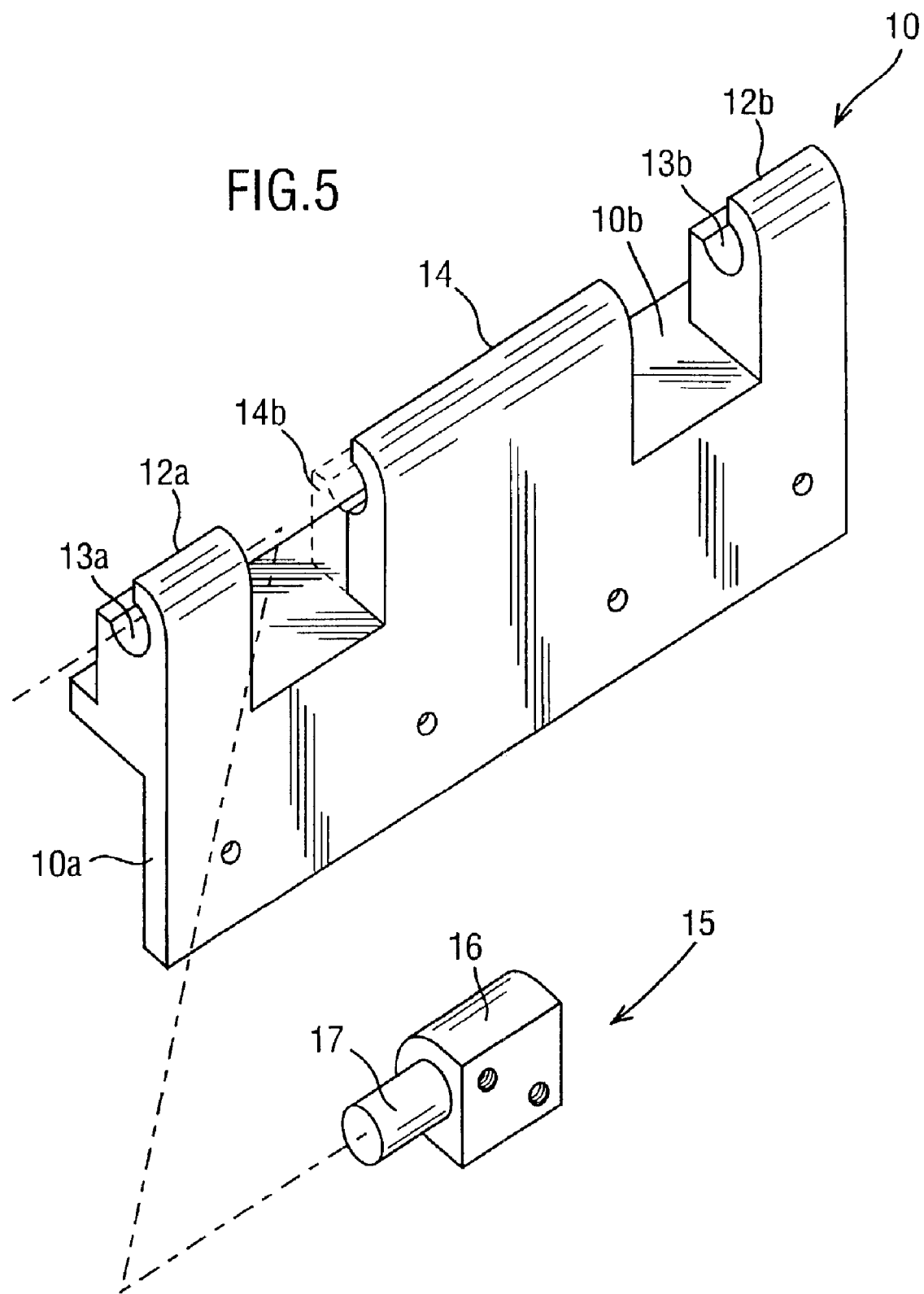

RACK-MOUNTED MODULE ACCESS

FIELD OF THE INVENTION

The invention relates to modular assemblies for housing electronic circuitry, and is particularly concerned with an assembly wherein a supporting structure or rack may receive one or more electronic modules, and wherein each module comprises a housing containing a number of circuit boards which are removable from the housing through an access door.

BACKGROUND TO THE INVENTION

In a rack-mounted modular circuit device, individual circuit boards may be made removable from a circuit module by providing the module with a removable access panel or an openable door on the front face of the module, and configuring the interior of the module housing with a number of guides for accepting circuit boards so that the boards may be slid into and out of the module through the access opening.

Rack-mounted modules are also conventionally provided with side flanges adjacent their front face, for securing the modules in place in the supporting structure or rack. The modules are provided with runners along their side surfaces which cooperate with guides in the rack so that the module may be slid horizontally into the rack until the side flanges at its front face contact uprights of the rack to prevent further rearward movement. The side flanges may then be attached to the uprights to secure the module in place. The modules are also conventionally provided with handles on their front faces, to enable the modules to be slid into and removed from the rack. Since the handles are required to be mounted to the module structure itself, the handles are conventionally placed at end regions of the front face of the module, so that the area between the handles is available for the provision of access doors. The provision of fixed areas of the front face of the module for the mounting of handles however results in areas of the interior of the module adjacent the side walls being inaccessible.

SUMMARY OF THE INVENTION

Embodiments of the present invention provide rack-mounted electronics modules wherein one or more hinged access doors are openable to afford substantially uninterrupted access to the entire width of the interior of the module.

According to one aspect of the present invention, a modular assembly for housing electronic circuitry comprises a supporting structure or rack, and a number of electronics modules mountable to the rack by engaging runners on the modules with horizontal guides in the rack. At least one of the modules comprises a housing having a front face which is accessible when the module is mounted to the rack, and at least one access opening extending substantially over the entire area of the front face of the module. An access door may be mounted to the module to cover the opening.

Further aspects of the invention provide a module, and a hinge assembly for an access door of an electronics module.

BRIEF DESCRIPTION OF THE DRAWINGS

Embodiments of the invention will now be described in detail with reference to the accompanying drawings, in which:

FIG. 5 is a perspective view of the hinge components.

DETAILED DESCRIPTION OF THE EMBODIMENTS

Figure 1:
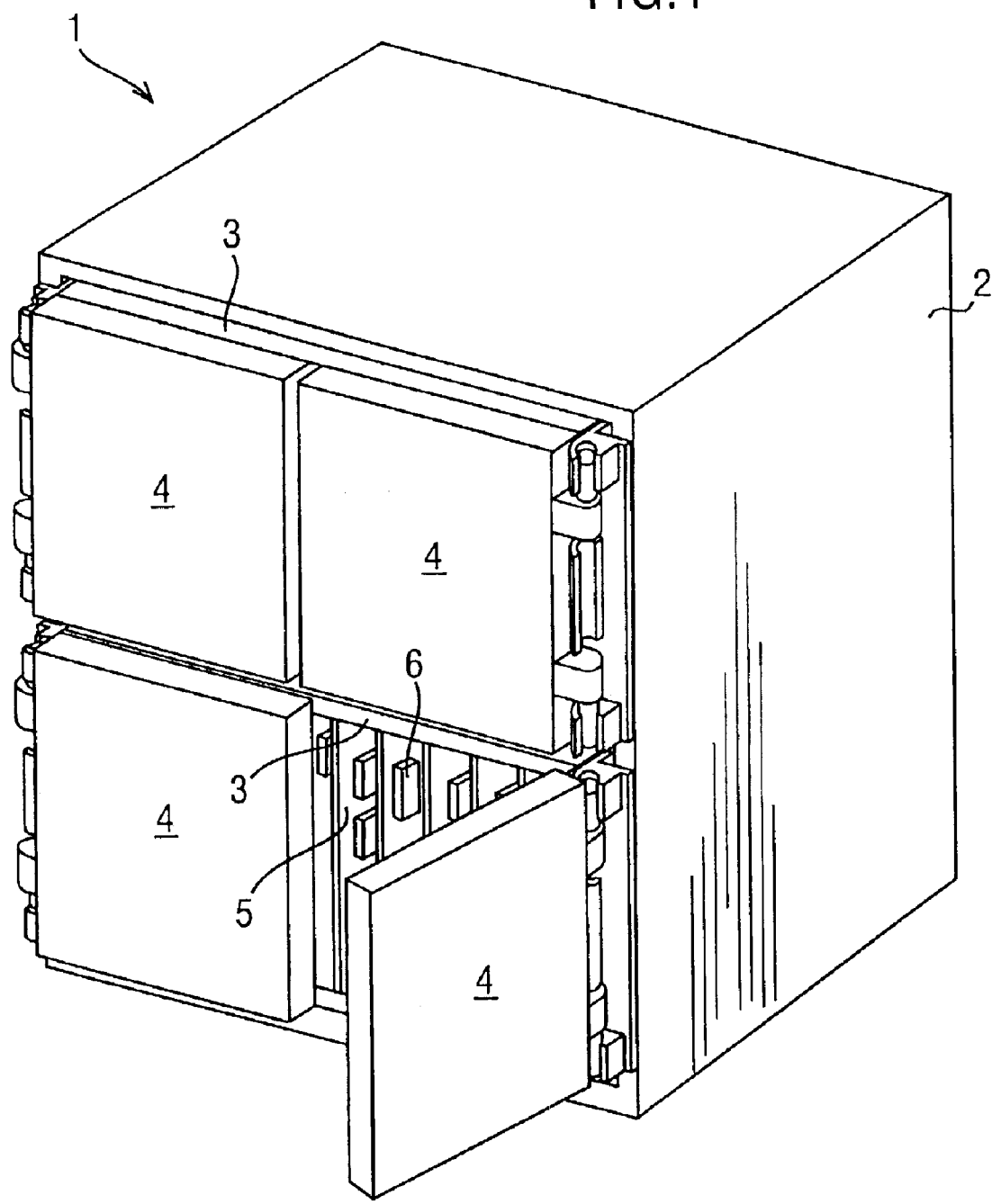
FIG. 1 is a perspective view of a modular assembly incorporating modules having frontal access doors.

Referring now to FIG. 1, there is shown a modular assembly 1 comprising a supporting structure or rack 2 containing two modules 3, the modules 3 being mounted one above the other. While the assembly 1 comprises two modules 3, it will be understood that the supporting structure 2 may be constructed to receive a column of three or more modules, and may further or alternatively be constructed to receive two or more columns of modules in side-by-side arrangement, each column comprising a plurality of modules.

Each module 3 has a pair of access doors 4 covering an opening extending across the entire width of its front face. Within each module 3 are housed a plurality of circuit boards 5, on which are mounted circuit components 6. The circuit boards 5 are received in guides within the modules 3, so that a faulty circuit board 5 may be slid out of the module 3 through the front face of the module, and a replacement circuit board may be mounted to the module 3 in the thus vacated slot.

In order to provide efficient use of space within each module 3, circuit boards 5 are mounted across the entire width of the module. In order to provide for circuit boards 5 mounted adjacent the side faces of the module 3 to be readily removable, the access doors 4 of the module 3 must be moveable to an open position in which the access door does not obstruct the opening in the front face of the module 3.

This is achieved in the embodiment shown in FIG. 1 by placing the hinge axis for the access door 4 at a position outboard of the side face of the module 3. The effect of this placement of the hinge axis is that when the access door is opened to or beyond ninety degrees from its closed position, no part of the access door 4 remains in front of the opening in the front face of the module 3 to obstruct the removal of circuit boards 5 therethrough.

Figure 2:
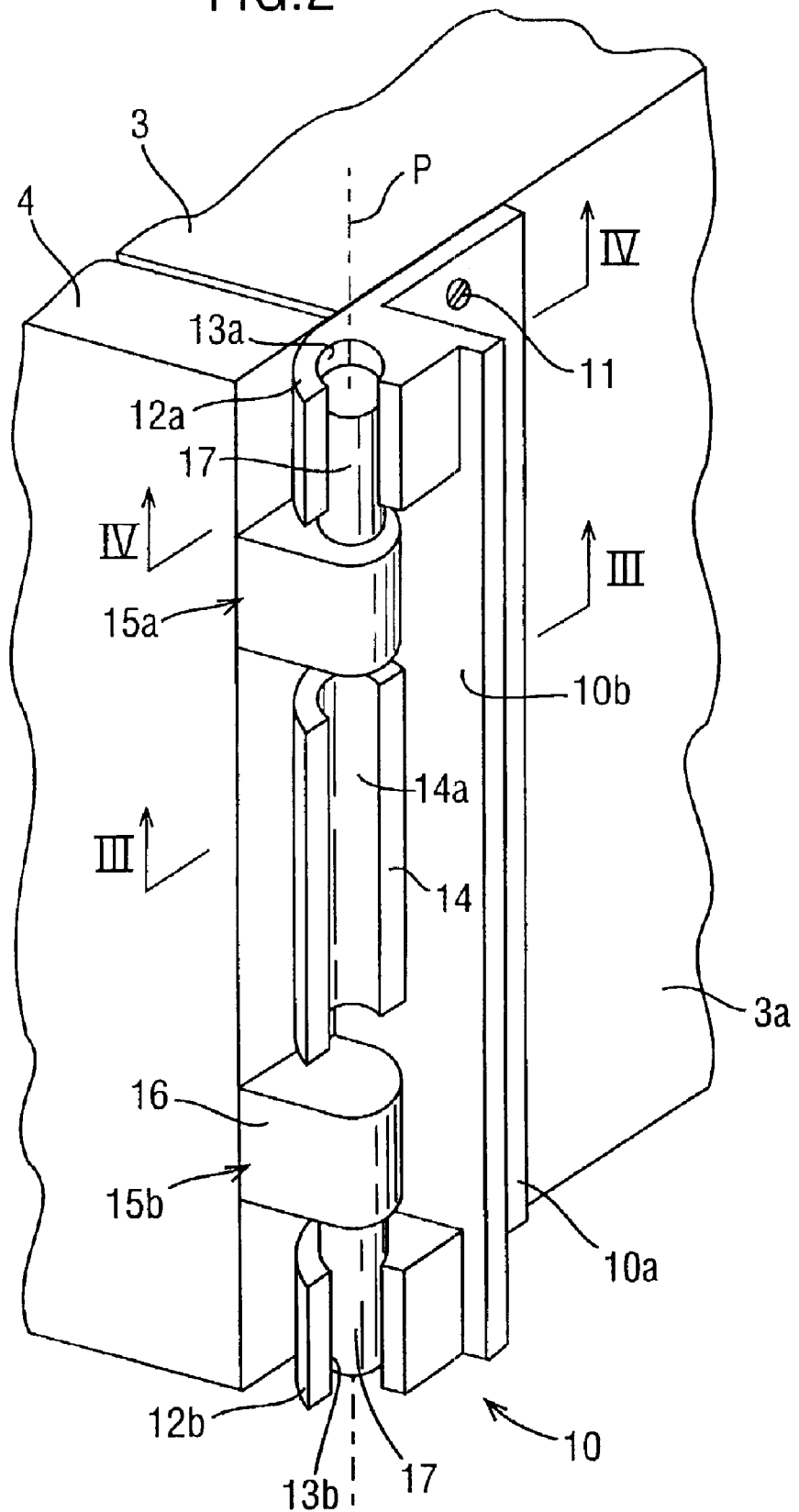
FIG. 2 is a perspective view, to an enlarged scale, of the hinge assembly for mounting an access door to a module.

FIGS. 2 to 5 show the hinge assembly for the access door 4 in greater detail. In FIG. 2, there is shown a detail view of the hinge assembly mounted to an electronics module 3. In this embodiment, the hinge is incorporated into a side flange component, and also provides a handle for withdrawing the module 3 from a rack.

Referring in detail to FIG. 2, the hinge assembly comprises a side piece 10 which is fixed to the side face 3a of the module 3. The side piece 10 comprises a mounting flange 10a which is secured to the module 3 by means of fasteners 11. Extending perpendicularly to the mounting flange 10a is a side flange 10b which is positioned so as to be substantially co-planar with the front face of the module 3, and to extend laterally away from the front face of the module.

On the side flange 10b upper and lower gudgeons are provided extending forwardly from the side flange 10b. The gudgeons 12a and 12b have aligned circular bores 13a and 13b defining a pivot axis P.

Situated on the side flange 10b between the gudgeons 12a and 12b is a handle formation 14 which is generally channellike, with the open side of the channel facing outwardly relative to the module 3.

To secure the door 4 to the module, the outer side edge of the door 4 is provided with pintles 15a and 15b to engage the gudgeons 12a and 12b. Each of the pintles 15a, 15b comprises a mounting element 16 and a pivot pin 17. The mounting elements 16 are fixed to the edge of the door 4 by means of fasteners such as screws, bolts, rivets, threaded studs, or the like. The pivot pins 17 are so dimensioned as to be receivable within the bores 13a, 13b of the gudgeons. In the arrangement shown, the weight of the door will be supported by the lower face of the mounting element 16 of the lower pintle 15b engaging the upper face of the lower gudgeon 12b.

Figure 3:
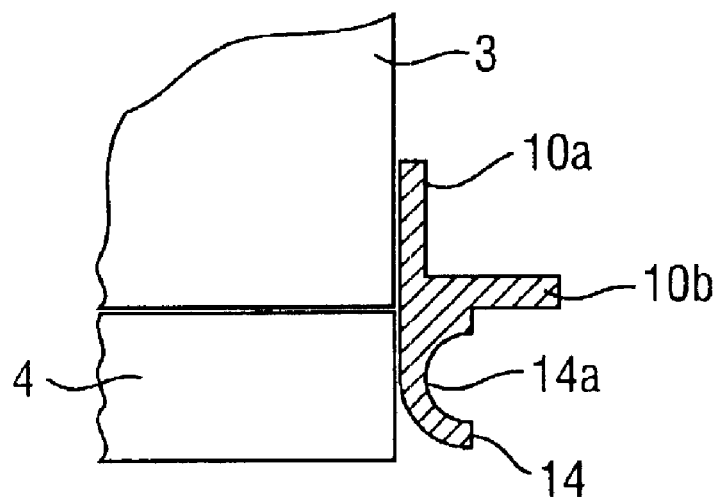
FIG. 3 is a sectional view taken along the line III—III in FIG. 2.
Figure 4:
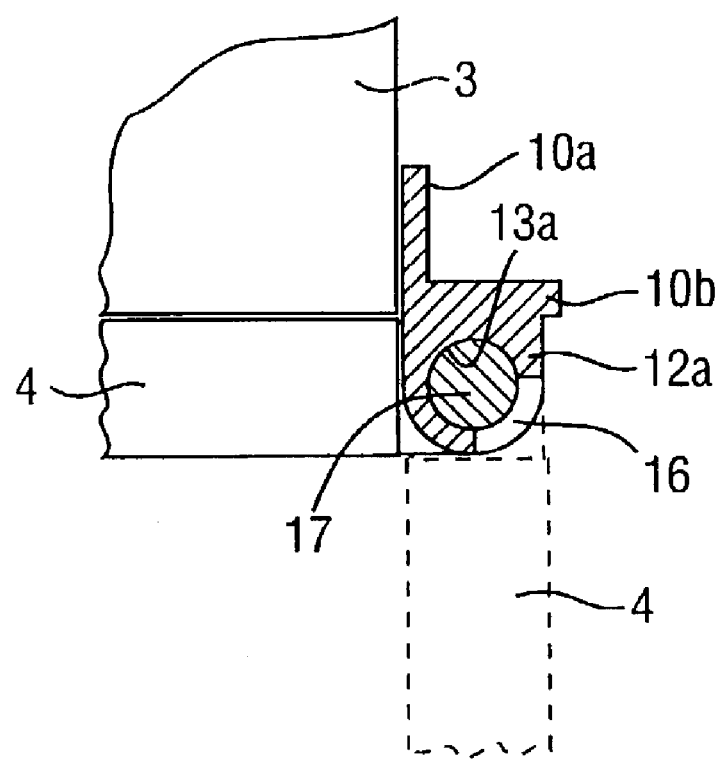
FIG. 4 is a sectional view taken along the line IV—IV in FIG. 2.

FIGS. 3 and 4 show sectional views of the hinge assembly taken along the lines III—III and IV—IV respectively, of FIG. 2. In FIG. 3, the semicircular channel-section handle 14 is seen facing away from the door 4. A similar handle 14 is provided at the opposite side of the module, and to remove the module from the rack a user places his fingers in the recess 14a of the handle 14 and pulls the module forwardly out of the rack.

In FIG. 4, the door 4 is shown in solid lines in its closed position and in broken lines in its opened position, rotated through ninety degrees from the closed position.

It will be appreciated that, with the door 4 in the position shown in broken lines in FIG. 4, the entire width of the module 3 is accessible from the front face. The positioning of the gudgeons 12a, 12b places the pivot axis P outboard of the open front face of the module 3, so that when the door is opened the entire front face is unobstructed.

Referring to FIG. 5, the side piece 10 is shown in more detail. In this embodiment, the side piece 10 is an integral component with the mounting flange 10a, side flange 10b, gudgeons 12 and handle 14 produced from a single extruded section whose cross-sectional shape is most clearly shown in FIG. 4. The gudgeons 12 are separated from the handle 14 by milling away the material of the extruded section, and the handle 14 is shaped by removing the portion 14b shown in phantom lines in FIG. 5.

In an alternative embodiment, the side piece may be formed from sheet metal, by folding a sheet to form an "L" section strip, the gudgeons and hand grip being struck from one flange of the "L" section strip.

In the embodiments described, the pintles 15 are mounted with their pivot pins 17 extending away from each other. It will be appreciated that the gudgeons 12a and 12b may be formed inboard from the upper and lower ends of the extruded section so that the pintles 15 may be mounted to the door 4 with their pivot pins 17 extending towards each other and engaging respective gudgeons 12. In such a structure, the weight of the door will be supported by the lower face of the mounting element 16 of the upper pintle engaging the upper face of the upper gudgeon 12a.

The pintles 15 may be formed from metal, or from hard plastics material such as nylon or acetal. The extruded section forming the mounting flange 10a, side flange 10b, gudgeons 12 and handle 14 may be of plastics material or may be of metal such as aluminium.

In the embodiment shown the gudgeons 12a do not completely enclose the bores 13a, 13b but have an open arc of approximately ninety degrees. This open arc may be adjusted so that the pintles 17 may be introduced into the bore 13a from the open side of the bore, by snap-engagement. This will involve removal of less material from the extruded section, since the clearance between the handle 14 and the gudgeons 12 need only be sufficient to accommodate the mounting element 16 of the pintle 15. If the pivot pin 17 is to be introduced into the gudgeon 12 in the axial direction of the pin, the clearance between the handle 14 and the gudgeon 12 will have to be at least equal to the combined axial length of the pivot pin 17 and the mounting element 16 of the pintle 15. It will be readily appreciated that when the pivot pins 17 of the pintles 15 are mounted to the gudgeons 12 by inserting them in the axial direction, the pivot pins must first be inserted into their respective gudgeons before the mounting elements 16 are both fixed to the door 4.

While the hinge comprises two gudgeons and two pintles in the above-described embodiments, it is to be understood that a single gudgeon may be provided on the hinge component to cooperate with a single pintle on the door.

In a further alternative embodiment, the pintles 15 may be replaced by elements in which a mounting portion 16 has a bore corresponding to the bore 13 of the gudgeon. The mounting portions may then be attached to the door 4, and offered up into spaces between the gudgeons 12 and handle 14, and pivot pins may then be inserted through the gudgeons 12 into the bores in the mounting elements to complete the connection. With such an arrangement, fixing elements such as grub screws may be provided to retain the pivot pins axially in position.

In the illustrated embodiment, the circuit boards 5 within the module 3 are arranged in vertical planes. It is to be understood that the circuit boards may alternatively be arranged to extend in horizontal planes from side to side within the housing to be removable through the open front face of the housing. In a further alternative arrangement, the module may comprises one or more principal circuit boards or "motherboards" mounted to the housing and oriented in vertical or horizontal planes, with one or more subsidiary or "daughter" boards mounted to the motherboards and oriented in horizontal or vertical planes, respectively.

When the circuit boards are mounted in horizontal planes, the space within the module is utilised to its fullest extent since the circuit boards can extend over the entire width of the module, but may still be removed and replaced through the front face of the module.

What is claimed is:

1. A module, demountably mountable in a rack, for housing electronic circuitry, comprising:

a housing having a pair of parallel side walls and a front face extending between the side walls and an access opening substantially co-extensive with the entire area of a front face of the housing; and at least one access door mounted to the housing for movement between a closed position in which the door closes the access opening, and an open position in which the opening is substantially unobstructed, the door and the housing being connected for relative movement about a pivot axis positioned in front of the plane of the opening and outboard of the plane of one of the said side walls of the housing, wherein a handle for removing the module from a rack is provided outboard of the plane of the said side wall of the housing and substantially in alignment with the pivot axis.

2. A module according to claim 1, wherein two access doors are mounted to the module, for movement about respective pivot axes positioned on either side of the housing.

3. A hinge component for a removable rack-mountable electronics module, comprising:

a mounting flange for attachment to a side face of a module housing, a side flange extending substantially perpendicularly to the mounting flange along one edge thereof, at least one gudgeon projecting from the face of the side flange remote from the mounting flange and having a bore to define a pivot axis, and a grip formed on the side flange adjacent the at least one gudgeon.

4. A hinge component according to claim 3, wherein two gudgeons are provided on the side flange and have their respective bores aligned, and wherein the grip is formed between the two gudgeons.

5. A hinge component for a rack-mountable electronics module according to claim 3, wherein the mounting flange, the side flange, the gudgeons and the grip are integrally formed.

6. A housing for a module, demountably mountable in a rack, comprising:

a pair of parallel side walls;

a front face extending between the side walls;

an access opening substantially coextensive with the entire area of the front face; and at least one hinge component having a mounting flange attached to a side wall of the housing, a side flange extending parallel to the front face of the housing, at least one gudgeon having a bore to define a pivot axis positioned in front of the plane of the opening and outboard of the plane of the side wall of the housing, and further comprising a handle mounted to the side flange outboard of the plane of the side wall of the housing and substantially in alignment with the pivot axis.

7. A modular structure for containing electronic circuitry, comprising a supporting structure and a plurality of modules detachably mounted thereto and including at least one module comprising:

a housing having a pair of parallel side walls and a front face extending between the side walls and an access opening substantially coextensive with the entire area of a front face of the housing; and at least one access door mounted for movement between a closed position in which the door closes the opening, and an open position in which the opening is substantially unobstructed, the door and the housing being connected for relative movement about a pivot axis positioned in front of the plane of the opening and outboard of the plane of the side wall of the housing, and the module further comprising a handle mounted to the side flange outboard of the plane of the side wall of the housing and substantially in alignment with the pivot axis.

* * * * *